United States Patent [19]
Wuu et al.

[11] Patent Number: 5,545,584
[45] Date of Patent: Aug. 13, 1996

[54] UNIFIED CONTACT PLUG PROCESS FOR STATIC RANDOM ACCESS MEMORY (SRAM) HAVING THIN FILM TRANSISTORS

[75] Inventors: Shou-Gwo Wuu, Chu-Tong; Mong-Song Liang, Hsin-Chu; Chen-Jong Wang, Hsin-Chu; Chung-Hui Su, Hsin-Chu, all of Taiwan

[73] Assignee: Taiwan Semiconductor Manufacturing Company, Hsinchu, Taiwan

[21] Appl. No.: 498,677

[22] Filed: Jul. 3, 1995

[51] Int. Cl.[6] .............................. H01L 21/70; H01L 27/00
[52] U.S. Cl. .................. 437/52; 437/47; 437/60; 437/195
[58] Field of Search ................. 437/47–48, 52, 437/40–41, 60, 915, 195, 101, 192; 257/903–904, 393, 67, 385

[56] References Cited

U.S. PATENT DOCUMENTS

| | | |
|---|---|---|
| 4,980,732 | 12/1990 | Okazawa .......................... 257/369 |
| 5,034,797 | 7/1991 | Yamanaka et al. ................ 257/904 |
| 5,145,799 | 9/1992 | Rodder ............................... 437/47 |
| 5,366,929 | 11/1994 | Cleeves et al. .................... 437/195 |
| 5,371,104 | 12/1994 | Liou et al. ......................... 437/192 |
| 5,374,591 | 12/1994 | Hasegawa et al. ................ 437/187 |
| 5,460,995 | 10/1995 | Kiyono et al. ...................... 437/52 |

*Primary Examiner*—H. Jey Tsai
*Attorney, Agent, or Firm*—George O. Saile

[57] ABSTRACT

A method was achieved for making a static random access memory SRAM by integrating or merging into the SRAM process a unified contact plug process that reduces the number of processing steps and forms low resistance ohmic contacts between $N^+$ and $P^+$ polysilicon layers. The plug process utilizes patterned features in the multi-layers of polysilicon and the high selective etching of silicon oxide to polysilicon to form all the contact concurrently, and thereby eliminate the need to etch contacts openings between each polysilicon layer. The unified contact plug method was demonstrate on the SRAM for making the a buried contacts for the node contacts on the SRAM, the bit line contacts and a $V_{ss}$ contact for the ground plane in the SRAM cell.

32 Claims, 5 Drawing Sheets

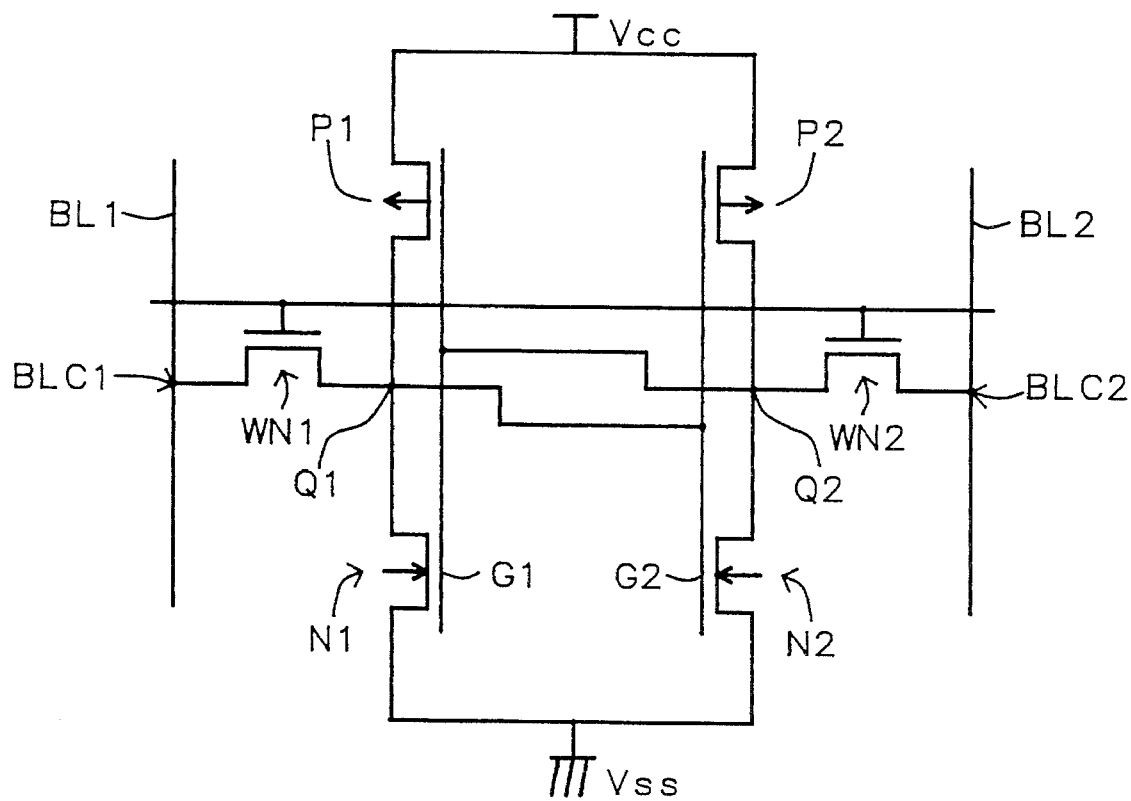
*FIG. 1 - Prior Art*
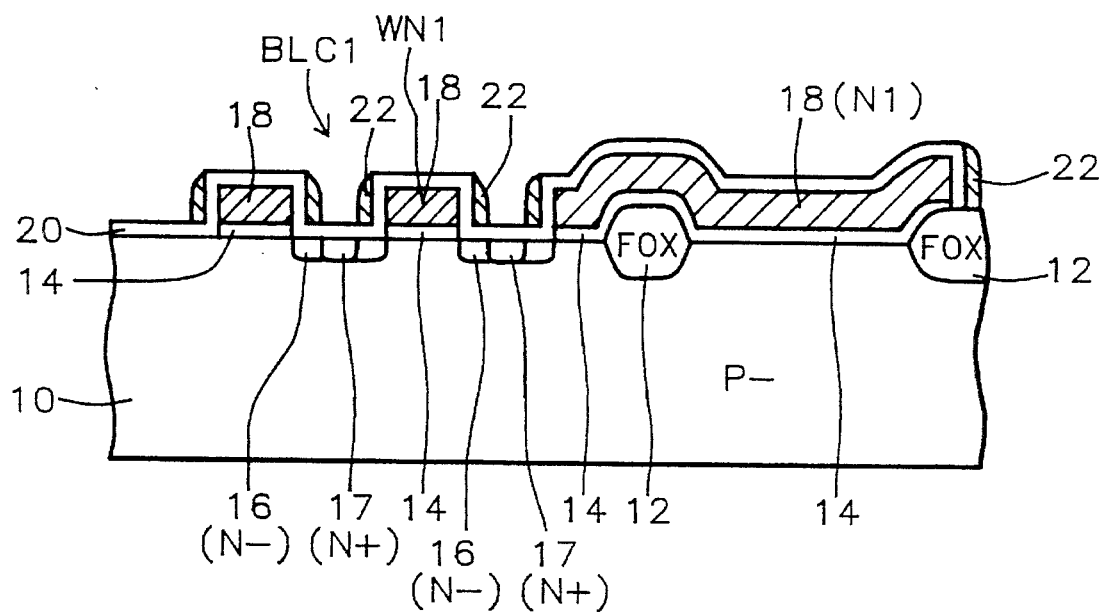
*FIG. 2*

UNIFIED CONTACT PLUG PROCESS FOR STATIC RANDOM ACCESS MEMORY (SRAM) HAVING THIN FILM TRANSISTORS

BACKGROUND OF THE INVENTION

(1) Field of the Invention

The present invention relates to integrated circuits on semiconductor substrates, and more particularly to a method of fabricating a unified contact plug structure for electrical interconnects on Static Random Access Memory (SRAM) having Thin Film Transistors (TFT).

(2) Description of the Prior Art

Both Dynamic Random Access Memory (DRAM) and Static Random Access Memory (SRAM) circuits are used extensively in the electronics industry for storing data for digital systems, such as computers. The SRAM is much faster than the DRAM circuit. Because of its speed the SRAM is ideal for use as a cache or buffer memory to speed up the system performance, and is therefore preferred over the DRAM device. Each of the memory cells on a SRAM device is usually composed of six transistors and functions as a static latch or flip flop circuit, does not have to be refreshed like a DRAM cell. Unfortunately, the SRAM devices require more processing steps than the DRAM and is therefore less cost effective for manufacture.

A circuit schematic for a typical six-transistor CMOS SRAM cell is shown in FIG. 1. Only one of the array of many cells is shown in FIG. 1. The trend in recent years is to fabricate the CMOS SRAMs using P channel Thin Film Transistors (TFTs) for the load transistors, labeled P1 and P2 in FIG. 1 and to use N-channel FETs formed in and on the substrate as the driver transistors, labeled N1 and N2. The N-channel FETs are also used as the pass transistors, and labeled WN1 and WN2 in FIG. 1.

Briefly, the SRAM circuit functions as follows. Address row and column decoder circuits on the periphery of the SRAM chip (not shown) select a memory cell. Referring to FIG. 1, the applied gate voltage on the word line WL switch on the pass transistors WN1 and WN2. The voltage at the nodes Q1 and Q2 between the two pairs of CMOS transistor P1, N1 and P2, N2, are sensed on the bit lines BL1 and BL2 during the read cycle to determine the state of the SRAM latch. During the write cycle when the write circuit (not shown) is enabled an impressed voltage on the bit lines can switch the voltage levels on the latch and thereby can switch the state of the cell that stored the binary data representing the one's and zero's.

Typically, during the fabrication of the SRAM circuit on a semiconductor substrate several layers of patterned conductivity doped amorphous or polysilicon films are used to form parts of the N and P-channel transistors and the intralevel connections. The polysilicon layers are separated and electrically insulated from each other by dielectric layers, such as silicon oxide. These various electrically conducting polysilicon layers and portions of the substrate are then interconnected by forming contact openings in the insulating layers between the various polysilicon layers, such as by photoresist masking and etching. Typically, the conventional SRAM cell requires a large number of masking and etching steps that include the patterning of about four polysilicon layers and about five masking and etching steps to form the contact openings between the polysilicon layers and to the substrate. It is also necessary, in the conventional process, to deposit the first polysilicon layer in two steps (split polysilicon deposition) to form the pass and driver transistors, thereby further increasing the number of process steps. Therefore, there is a very strong need in the semiconductor industry to reduce the number of processing steps.

Another concern with the conventional SRAM cell is the non-ohmic stacked contacts that are form in the contact openings, and occurs at interfaces between polysilicon layers having different types of conductive dopants ($P^+/N^+$). These $P^+/N^+$ diode like junctions delay the on current ($I_{on}$) during switching and degrade the performance of the SRAM cell.

Several methods have been described for improving the SRAM-Thin Film Transistor (TFT) and for forming metal plug contacts to the substrate. For example, T. Okazawa, U.S. Pat. No. 4,980,732 describes a method for making TFTs with lower off currents by off setting the drain side of the FET channel and in the prior art of the same patent there is described the use of aluminium to form an ohmic contact between the P doped drain of the P-channel TFT and source of the N-channel FET formed on the substrate. Also, methods for improving the tungsten metal plugs formed in contact openings in insulators on the substrate is described by T. Hasegawa et al, U.S. Pat. No. 5,374,591, by J. M. Cleeves et al, U.S. Pat. No. 5,366,929. However, none of the cited references address the need for reducing the process steps during manufacturing of the SRAM device.

Therefore, there is still a strong need in the semiconductor industry for methods and improved structures for reducing the number of masking levels and process steps, and thereby provide a cost effective process, while at the same time improving the circuit performance by reducing the contact resistance between the polysilicon layers, such as on SRAM circuits.

SUMMARY OF THE INVENTION

It is a principle object of the present invention to provide a unified contact plug method for fabricating an array of SRAM cells having substantially fewer photoresist masking steps and fewer processing steps than a conventional SRAM process, and thereby improve process yield and reduce the manufacturing cost.

It is another object of this invention to simultaneously form low resistance ohmic contacts between the $N^+$ and $P^+$ polysilicon layers using this unified contact plug structure and, thereby improving the switching performance of the SRAM cell.

It is still another objective of this invention to eliminate the need for a split polysilicon deposition for forming the field effect pass transistor and driver transistor on the SRAM cell, and thereby further reducing the processing steps.

In accordance with the objects of this invention, a method is described for fabricating an array of SRAM cells having a unified contact plug structure for interconnecting the various polysilicon layers. The node contacts, bit line contacts and the ground contact are formed concurrently on the SRAM cell.

The method starts by providing a $P^-$ (boron) doped single crystal semiconductor substrate having device areas on the substrate surface that are electrically isolated each other by Field OXide (FOX) areas. A thin gate oxide is then formed on the device areas. An $N^+$ doped first polysilicon layer is deposited and patterned, such as by photoresist masking and plasma etching, to form the gate electrodes for N-channel field effect transistors for the pass transistors and the driver transistors of the SRAM circuit on the device areas. The first polysilicon layer also forms the intraconnecting word lines for the pass transistors. Lightly doped $N^-$ source/drain areas are then formed in the device areas adjacent to the gate electrodes by ion implantation. A conformal cap insulating layer composed of, for example, silicon oxide is deposited on the substrate to coat and electrically insulate the gate electrodes. An undoped conformal polysilicon layer is then deposited and anisotropically etched back to the cap oxide forming polysilicon sidewall spacers on the sidewalls of the gate electrodes to increase alignment tolerance. $N^+$ doped source/drain contact areas are then formed adjacent to the sidewall spacers by another ion implantation, thereby completing the N-channel FETs.

The P-channel FETs for the SRAM latch circuit and the unified contact plug structure are formed next. The process continues by depositing a blanket first insulating layer composed of, for example, silicon oxide on the N-channel FETs and elsewhere on the substrate. Important in this invention and unlike the conventional SRAM process, contact openings are not etched in the first insulating layer at this time. Instead, a second polysilicon layer, also doped $N^+$, is deposited on the second insulating layer. The second polysilicon layer is patterned to form an interconnecting layer, and important in this invention, openings are also etched in portions of the second polysilicon layer aligned over the FET source/drain contact areas. A second insulating layer is deposited on the patterned second polysilicon layer and elsewhere on the exposed first insulating layer. Again contact openings are not etched, but an $N^+$ doped third polysilicon layer is deposited and patterned to form the gate electrodes for the thin film transistors (TFT), and the third polysilicon layer also have portions that are adjacent to, but provide opening over the source/drain areas of the N-channel FET that are to later be the node contacts for the SRAM cell. The openings are formed during the patterning of the TFT gate electrodes and do not require an additional masking step. A third insulating layer is then deposited on the patterned third polysilicon layer and elsewhere on the exposed second insulating layer, and providing the gate oxide layer for the P-channel TFTs over the gate electrodes that are formed from the third polysilicon layer. A lightly doped ($N^-$) fourth amorphous or polysilicon layer is deposited on the gate oxide layer and selectively doped with a P type impurity using a photoresist mask to form the TFT source/drain areas adjacent to the TFT gate electrodes. The fourth polysilicon layer is then patterned, and thereby defines the $N^-$ channel regions over the thin film transistor (TFT) gate electrodes, and also defining the TFT source/drain areas. A fourth insulating layer having a low flow temperature, such as a borophosphosilicate glass (BPSG) or a doped tetraethosiloxane (BPTEOS) oxide is deposited and annealed to provide an essentially planar surface.

Now, important to the invention, a photoresist mask is formed having openings aligned over the portions of the partially completed SRAM structure to which the unified contact plugs are to be formed. The contact openings for the unified contact plugs are then etched using a dry (plasma) etch that selective and anisotropically removes the various insulating layers in the photoresist opening to the various patterned polysilicon layers, that act as an etch stop. For example in the node contacts for the SRAM, the fourth, third, second, first and cap insulating layer are etched to the source/drain contact areas of the N-channel FETS formed in the substrate device areas. As the insulating layers are removed sequentially portions of the polysilicon layers are exposed in the contact openings, and thereafter the patterned portion of the exposed polysilicon layer provides a self-aligning effect for the continued etching of the remaining exposed insulating layer in the contact opening. By this method all contacts are opened concurrently and the appropriate polysilicon layers are exposed in the various contact opening for interconnecting the required circuit elements.

Metal plugs are formed in the contact opening to complete the interconnections. For example, a tungsten (W) metal can be used. The tungsten can be deposited by chemical vapor deposition using a reactant gas containing tungsten hexafluoride ($WF_6$). The metal layer is then $CF_4$ plasma etched or chemically/mechanically polished back to form the unified plug structure on the SRAM circuit. The SRAM circuit is then completed to the first level metal interconnect by depositing a fifth insulating and etching a second set of contact openings to the required metal plugs and depositing and patterning a first metal layer, such as aluminium or an aluminium-copper alloy.

BRIEF DESCRIPTION OF THE DRAWINGS

The objects and other advantages of the invention will become more apparent in the preferred embodiment when read in conjunction with the following drawings.

FIG. 1 shows an electrical schematic of a prior art six transistor SRAM cell.

FIGS. 2 through 5 show the process sequence in schematic cross sectional for building an improved SRAM cell having the unified contact plug structure. Only a portion of the cell is depicted in the Figs.

DESCRIPTION OF THE PREFERRED EMBODIMENTS

Figure 3:
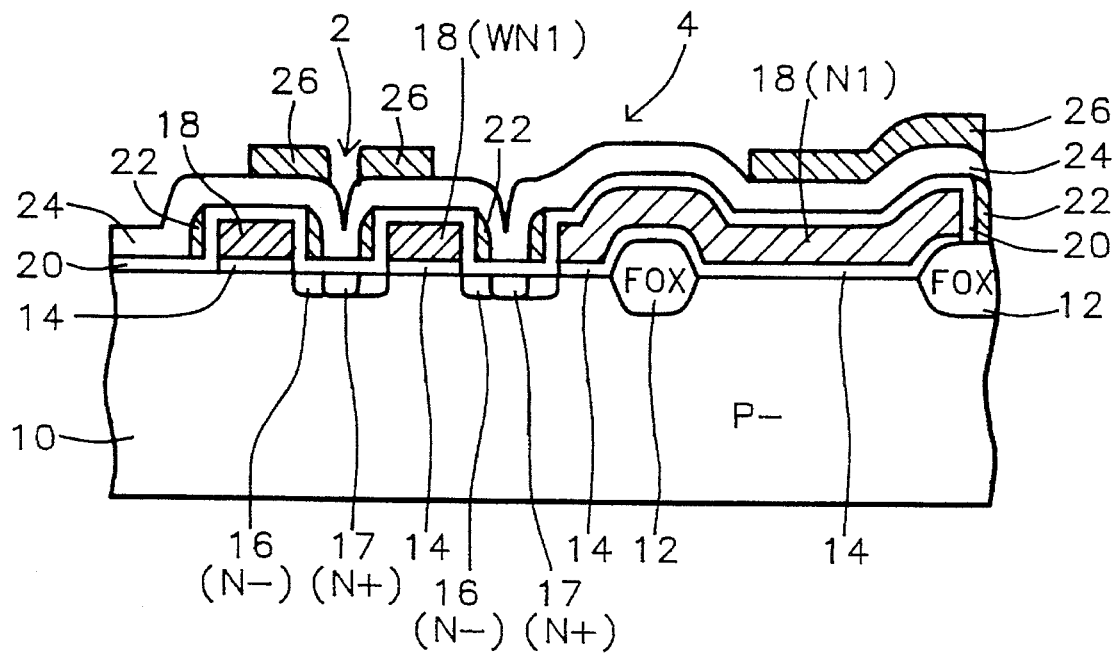

The present invention describes an improved method for fabricating arrays of static random access memory (SRAM) cells in which the interconnections of the discrete circuit elements are formed using a novel unified contact plug structure. The method reduces the number of masking steps and etching steps and also provides low resistance ohmic contacts between $N^+$ and $P^+$ polysilicon layer, which is difficult to accomplish by the convention stacked contact of the prior art. Although the present invention describes a method for making an improved SRAM circuit, it should be well understood by those skilled in the art that the unified contact plug technology can be equally applied to other semiconductor integrated circuits where reduction in processing steps is desired, and more particularly on other circuits having P-channel TFT where low resistance ohmic contacts are also required.

Referring now to FIGS. 2 through 5, the method is described for forming the unified contact structure during the fabrication of a SRAM device. The SRAM process begins by forming Field OXide (FOX) areas 12 that electrically isolated device areas on a semiconductor substrate 10. The substrate 10 is typically composed of a P doped single crystal silicon on which the SRAM cells are to be built. For practical reasons only a portion of the SRAM memory cell is shown in FIG. 2. Typically, the field oxide 12 is formed by selective oxidation of the regions around the device areas. For example, the conventional LOCal Oxidation of Silicon (LOCOS) process can be used, and the oxide is usually grown to a thickness of between about 4000 to 6000 Angstroms.

After forming the field oxide 12, the surface of the device areas are thermally oxidized to form a gate oxide 14. The gate oxide is preferably grown to a thickness of between about 60 to 200 Angstroms. A blanket first polysilicon layer 18 is then deposited by low pressure chemical vapor deposition (LPCVD) using for example silane ($SiH_4$) as the reactant gas. Layer 18 is then doped with an N-type impurities, for example, by ion implantation or alternatively by in situ doping with arsenic (As) or phosphorus (P). The dopant concentration in layer 18 is between about $1.0\ E\ 18$ to $1.0\ E\ 21$ atoms/$cm^3$, and the thickness of layer 18 is between about 1000 to 3500 Angstroms. The first polysilicon layer 18 is then patterned using conventional photolithographic techniques and anisotropic plasma etching to form the gate electrodes 18 for the N-channel FET. The N-FETs are used as the pass transistors, such as WN1, and as the driver transistors, such as N1 for the latch portion of the SRAM circuit, as depicted in the circuit schematic of FIG. 1. These two transistors are similarly labeled in the schematic cross sections of FIG. 2. $N^-$ lightly doped drains (LDD) are then formed in the substrate 10 adjacent to the gate electrodes 18, for example by implanting phosphorus ion ($P^{31}$) at a dose of between about $1.0\ E\ 13$ to $1.0\ E\ 15$ ions/$cm^2$ and at an implant energy of between about 25 to 40 KeV. The patterned polysilicon layer 18 also serves as the inter-connecting word lines for the pass transistors WN1 and WN2, such as word line WL depicted in FIG. 1. The word lines, however, are not visible in the cross sections of FIG. 2.

A cap oxide 20, preferably composed of a silicon oxide is deposited over and insulates the gate electrodes 18, and is formed by chemical vapor deposition (CVD) using a reactant gas, such as tetraethoxysilane (TEOS). The thickness of Layer 20 is preferably between about 500 to 1000 Angstroms. Sidewall spacers 22 are formed next by depositing a conformal undoped polysilicon sidewall layer 22 and anisotropically etching back the layer 22 to the surface of the cap oxide, thereby forming the spacers 22 on the sidewalls of the gate electrodes, as shown in FIG. 2. The undoped polysilicon layer 22 is deposited by LPCVD using, for example, silane, and the thickness of layer 22 prior to etch back is between about 1000 to 2000 Angstroms. The N-channel FETs are now completed by forming the $N^+$ doped source/drain contact areas 17 by ion implanting a N type dopant, such as arsenic or phosphorus, as is also depicted in FIG. 2. Alternatively, the polysilicon sidewalls 22 can be replaced with sidewalls formed by more conventional means from a single insulating layer, such as silicon oxide. The cap oxide layer 20 and the undoped polysilicon layer 22 are replaced by a single LPCVD silicon oxide layer (not shown in FIGS. 2–6) having a thickness of between about 700 to 2500 Angstroms, and anisotropically etched back.

Figure 4:
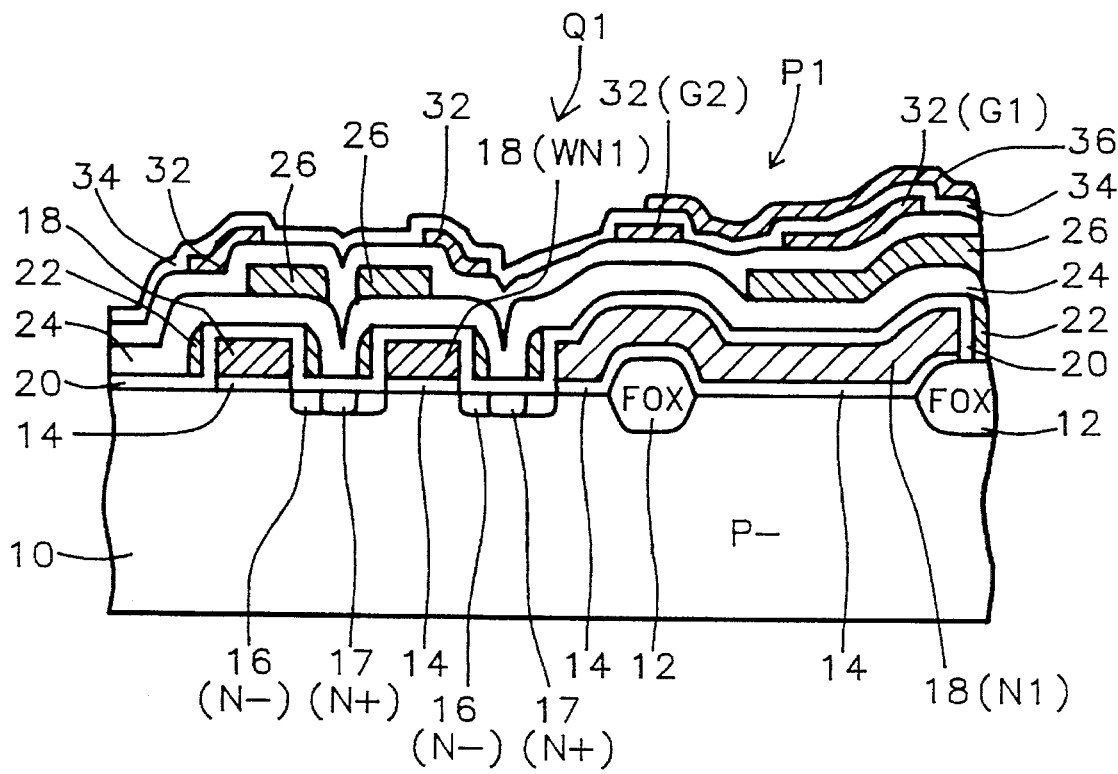
Figure 5:
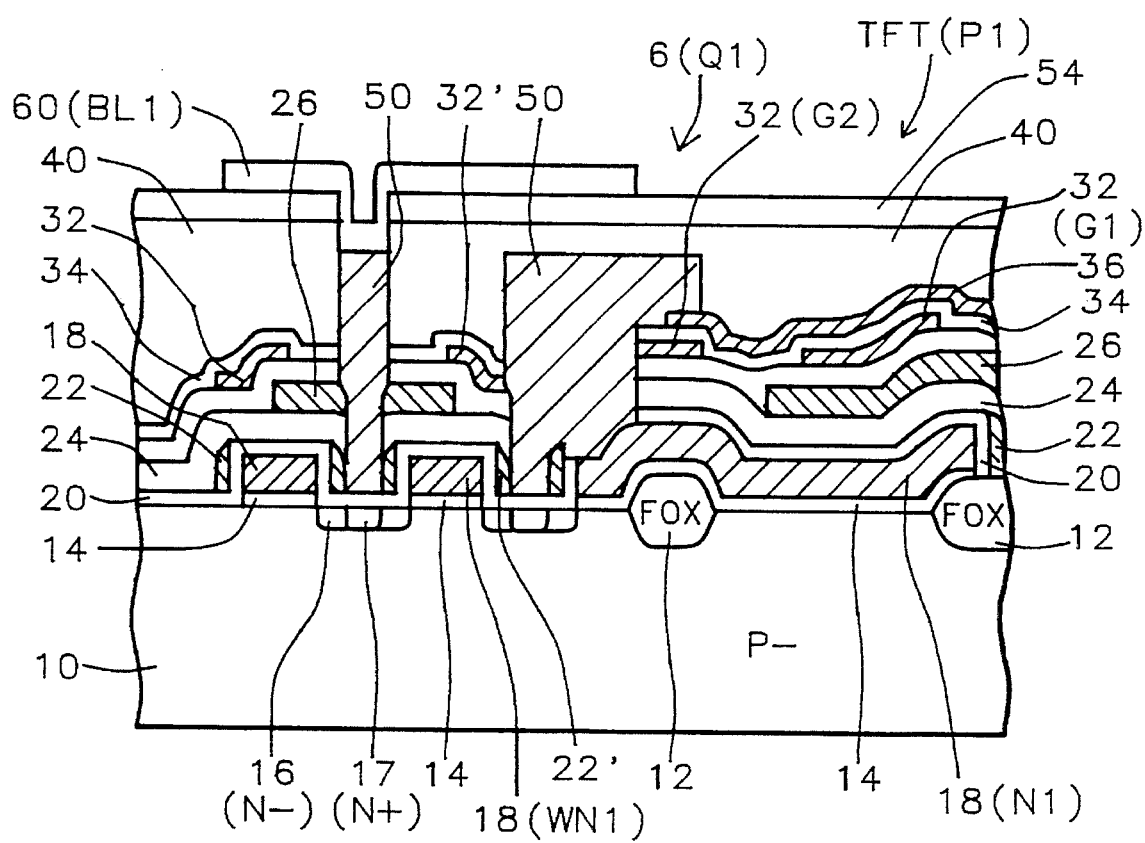

Referring now to the remaining FIGS. 3 through 5 the method for forming the P-channel thin film transistors (TFT) and the interconnecting unified contact structure is now described. Although, for practical reasons, only one of the unified contacts formed at node contact Q1, as depicted in FIG. 1, is described, it should be clearly understood that the other node contact Q2 is likewise formed and indeed all the node contacts for the array of SRAM cells is formed in like manner during the same processing steps. Also shown in FIGS. 3 to 5, and also formed concurrently is the bit line contact, labeled BLC1, as is also depicted in FIG. 1.

Continuing now with the process, as shown in FIG. 3, a first insulating layer 24 is deposited on the completed N-channel FETs and elsewhere on the cap oxide 20. The layer 24 is preferably a silicon oxide deposited at a medium temperature range (650° to 800° C.) using, for example, LPCVD and a TEOS gas. The preferred thickness of layer 24 is between about 700 to 2000 Angstroms. Unlike the conventional prior art process, in the present invention contact openings to the source/drain areas are not etched at this time, and thereby a masking step and a etch step are eliminated.

Still referring to FIG. 3, a second polysilicon layer 26 is blanket deposited on the first insulating layer 24. The layer 26 is preferably deposited by LPCVD using, for example silane, similar to the deposition method for the first polysilicon 18. Layer 26 is also doped $N^+$ with phosphorus ($P^{31}$) by ion implantation and having a dopant concentration in the range of between about $1.0\ E\ 18$ to $1.0\ E\ 21$ atoms/$cm^3$, and a thickness in the range of between about 700 to 3000 Angstroms. The second polysilicon layer is then patterned by conventional photolithographic techniques and anisotropic plasma etching to provide the electrically conducting patterns that will later form portions of the SRAM circuit. Another important feature of the invention is the formation of an opening 2 (FIG. 3) in a portion of the layer 26, during the etching, that is aligned over of the source/drain contacts of the N-FET WN1 that is to later be the bit line contact BLC1 (FIG. 1) for the SRAM cell. The polysilicon layer is also patterned to provide an opening 4 over the second source/drain area of N-FET WN1, which is later to the node contact.

Referring next to FIG. 4, the formation of the P-channel thin film transistors (P1 in FIG. 1) are described. A second insulating layer 30 is deposited on the patterned second polysilicon layer 26 and elsewhere on the first insulating layer 24. The insulating Layer 30 is preferably composed of silicon oxide and is also deposited using LPCVD and TEOS gas, similar to the method used for depositing the first insulating layer 24. The thickness of layer 30 is preferably between about 700 to 2000 Angstroms. Contact openings are also not etched in layer 30, at this time, as commonly practiced in the conventional SRAM process method, and therefore this invention reduces further the number of masking and etching steps.

The P-channel thin film transistors (TFT) are now formed on the second insulating layer 30. Still referring to FIG. 4, an $N^+$ third polysilicon layer 32, is deposited on insulating layer 30, and then patterned using conventional photolithographic techniques and anisotropic plasma etching to form the gate electrodes for the thin film transistors (TFTs). The third polysilicon layer 32 is deposited by low pressure chemical vapor deposition (LPCVD) using, for example, a reactant gas containing silane ($SiH_4$), and the preferred thickness of polysilicon layer 32 is between about 300 to 1000 Angstroms. The polysilicon layer is doped with an N type dopant such as arsenic ($As^{75}$) or phosphorus ($P^{31}$) by ion implantation or alternatively, the layer 32 can be in situ doped by adding a dopant gas to the silane, such as phosphine ($PH_3$) during the CVD deposition. The preferred dopant concentration in layer 32 is between about $1.0\ E\ 18$ to $1.0\ E\ 21$ atoms/$cm^3$.

The polysilicon layer 32 is then patterned using conventional photolithographic techniques and anisotropic plasma etching to define the TFT gate electrodes, such as G1 and G2 in FIG. 1, and also labeled G1 and G2 in FIG. 4. The preferred anisotropic etching, for example, can be performed in a reactive ion etcher (RIE) using a gas mixture containing chlorine ($Cl_2$) and a carrier gas such as argon (Ar).

Now an important feature of the invention, as shown in FIG. 4, the polysilicon layer 32 is patterned to form a portion of the gate electrode G2 extending over to and aligned next to the source/drain contact area of the N-channel FET WN1 that is also the node contact Q1 in FIG. 1. The polysilicon layer 32 is also patterned to provide a portion aligned over the edge of the sidewall spacer 22 of the N-channel FET WN1.

As will soon become clear, the patterned polysilicon layers 26 and 32 serve a double purpose. They provide the building elements of the semiconductor devices while also serving as an etch stop mask for forming the various contact openings and interconnects that are require for the SRAM circuit.

Not shown in the FIG. 4, but in like fashion, similar structures are formed from the polysilicon layer 32 for the second SRAM node Q2 in the cell, as depicted in FIG. 1, wherein the gate electrode G1 is similarly aligned to the node Q2, and each cell area in the array of cells is similar formed.

A third insulating layer 34, also shown in FIG. 4, is deposited over the patterned third polysilicon layer 32 from which the gate electrodes G1 and G2 formed. This layer 34 serves as the gate oxide for the thin film transistors. The preferred deposition is carried out in a relatively high temperature (about 800° C.) LPCVD system using a gas mixture of, for example, composed of dichloromethane ($SiH_2Cl_2$) and nitrous oxide ($N_2O$). The gate oxide is relatively thin. For example, the preferred thickness of this TFT gate oxide is between about 50 to 500 Angstroms.

A relatively thin fourth polysilicon layer 36 is now deposited on the TFT gate oxide 34 at a relatively low temperature to minimize the crystal gain size in the layer. For example, at deposition temperatures of less than 560° C. the layer is considered essentially amorphous, but for the sake of discussion and continuity is referred to here as the "fourth polysilicon layer". The polysilicon or amorphous silicon layer 36 serves as a channel layer for the thin film transistors (TFTs). The amorphous layer 36 is typically deposited by LPCVD using a reactant gas containing silane ($SiH_4$) or a higher hydride of silicon, such as disilane ($Si_2H_6$), and having a preferred deposition temperature is in a range of between about 450° to 560° C. The preferred thickness of layer 36 is between about 150 to 500 Angstroms. Typically, the layer 36 is lightly doped with an N-type dopant, such as arsenic (As) or phosphorus (P) to prevent inversion when the P-channel TFT is in a nonconducting state (off) and to provide for the $P^+/N^-$ junctions between the TFT FET channel and the source/drain areas. The N type dopant is typically achieved by ion implantation of arsenic ($As^{75}$) of phosphorus ($P^{31}$) and the preferred concentration in layer 36 is between about 1.0 E 16 to 1.0 E 18 atoms/cm$^3$.

An important advantage of this invention over the prior art, is that contact openings are not required in the TFT gate oxide layer 34, and therefore the gate oxide is not exposed to photoresist which can contaminate the gate oxide, such as with sodium (Na) ions. And it is a further advantage of the present invention that the masking and etching steps are reduce yet a third time.

Still referring to FIG. 4, a photoresist implant mask (not shown) is used to mask portions of layer 36 over the gate electrodes where the $N^-$ doped channels for the P-channel TFTs are required. The polysilicon layer 36 is now subjected to an ion implantation using a P type dopant, for example, using boron ($B^{11}$). This ion implant forms the source/drain doped regions of the P-channel TFTs, and also provide a conducting layer elsewhere on the substrate. The preferred boron ($B^{11}$) dopant concentration in layer 36, after ion implantation, is between about 1.0 E 18 to 1.0 E 20 atoms/cm$^3$.

The fourth polysilicon layer 36 is now patterned using photolithographic techniques and anisotropic plasma etching to defining the channel width over the TFT gate electrodes, the TFT source/drain areas, and to provide portions elsewhere on the substrate for interconnections portion that include the source/drain areas. The patterned $P^+$ doped portion of layer 36 for the P1 TFT having the gate electrode G1 also extends over the portion of the G2 gate electrode that extends to the node contact Q1 of the N-FET WN1, as shown in FIG. 4.

Now as shown in FIG. 5, a fourth insulating layer 40 is deposited over the patterned layer 36. Preferably the insulating layer 40 is composed of a low flow glass to provide a leveling effect for planarizing the surface. For example, layer 40 can be deposited by low pressure chemical vapor deposition (LPCVD) reactor by decomposing a tetra-ethosiloxane (TEOS) while introducing dopants such as phosphine ($PH_3$) and diborane(6) ($B_2H_6$) to form the BPTEOS glass. The glass is then annealed for about between 15 to 60 minutes at a temperature of between about 800° to 900° C. to level the glass layer 40.

Referring still to FIG. 5, photolithographic techniques and selective and anisotropic plasma etching is used to form, concurrently, all the contact openings that are required to interconnect the various polysilicon layers and the source/drain contacts on the substrate to reduce the number of masking steps by three and the number of etching steps by three in the fabrication of the SRAM device. More specifically, as shown in FIG. 5, the node contact 6 (Q1 in FIG. 1) is formed by etching the contact opening 6 so that it extends over the drain area (layer 36) of the TFT and also extends over a portion of the third polysilicon layer 32'. Now as the contact opening 6 is the polysilicon layers function as an etch stop mask. By this means the insulating layer 40 is etched to the surface of the fourth polysilicon layer 36 (TFT channel layer) and stops while the exposed gate oxide layer 34 is etched to the gate electrode layer 32 (G2 in FIG. 1), and then the masking effect of layer 32 and 32' result in the contact opening being etched in the second and first insulating layers 30 and 24, in that order and then through the cap oxide 20 to the source/drain area of FET WN1, and to the gate electrode of the driver FET N1, also labeled N1 in FIG. 1. In like fashion, and at the same time the contact opening 8 (BLC1 in FIG. 1) to the bit line contact which is the second source/drain contact of FET WN1 is also etched. The contact opening 8 is designed larger than the opening 9 in the second polysilicon layer 26, so that the final etched opening is aligned to the opening in the polysilicon, as shown in FIG. 5. The selective etching is accomplished in a reactive ion etcher using an etch gas mixture that has a high etch rate selectivity of silicon oxide to silicon. For example, the etching can be accomplished in a carbon tetrafluoride ($CF_4$) containing a hydrogen gas ($H_2$) or alternatively in a gas mixture containing trifluoromethane ($CHF_3$). The preferred etch rate selectivity of silicon oxide to silicon or polysilicon being greater than about 30 to 1.

Also shown in FIG. 5, the unified contact plugs is now completed by depositing a conformal metal layer 50 to fill the openings 6 (Q1) and 8 (BLC1) and thereby making an electrical contact between the various polysilicon layer to form the interconnections. For example, in the Q1 node contact 6, the metal contact interconnects the drain of the TFT (P1) to the gate (G2) of the second TFT in the cell (P2) and also to the gate of the driver FET (N1) and to source/drain of the pass FET (WN1). Because the $P^+$ and $N^+$ layers are connected by metal the contacts are ohmic and of low resistance.

The metal layer 50 is then etched back to form the electrically isolated conductive plugs, also labeled 50 in FIG. 5. The conductive plugs 50 are preferably composed of a refractory metal, such as tungsten (W), which also functions as a barrier layer to metal penetration from the first metal layer into the silicon contacts on the substrate. The tungsten metal is preferably conformally blanket deposited using CVD and the thermal decomposition of tungsten hexafluoride ($WF_6$). FIG. 5 also shows the SRAM completed up to a first level metal 60. A fifth insulating layer 54 is deposited by CVD using a reactant gas such as tetraethosiloxane (TEOS). The preferred thickness of layer 54 is between about 700 to 2000 Angstroms. Contact openings are formed, by photo-resist masking and plasma etching, to the required metal plugs. A first metal layer 60 is deposited, such as, aluminium can be deposited and then patterned by photoresist masking and plasma etching forming the first metal interconnect level.

Figure 6:
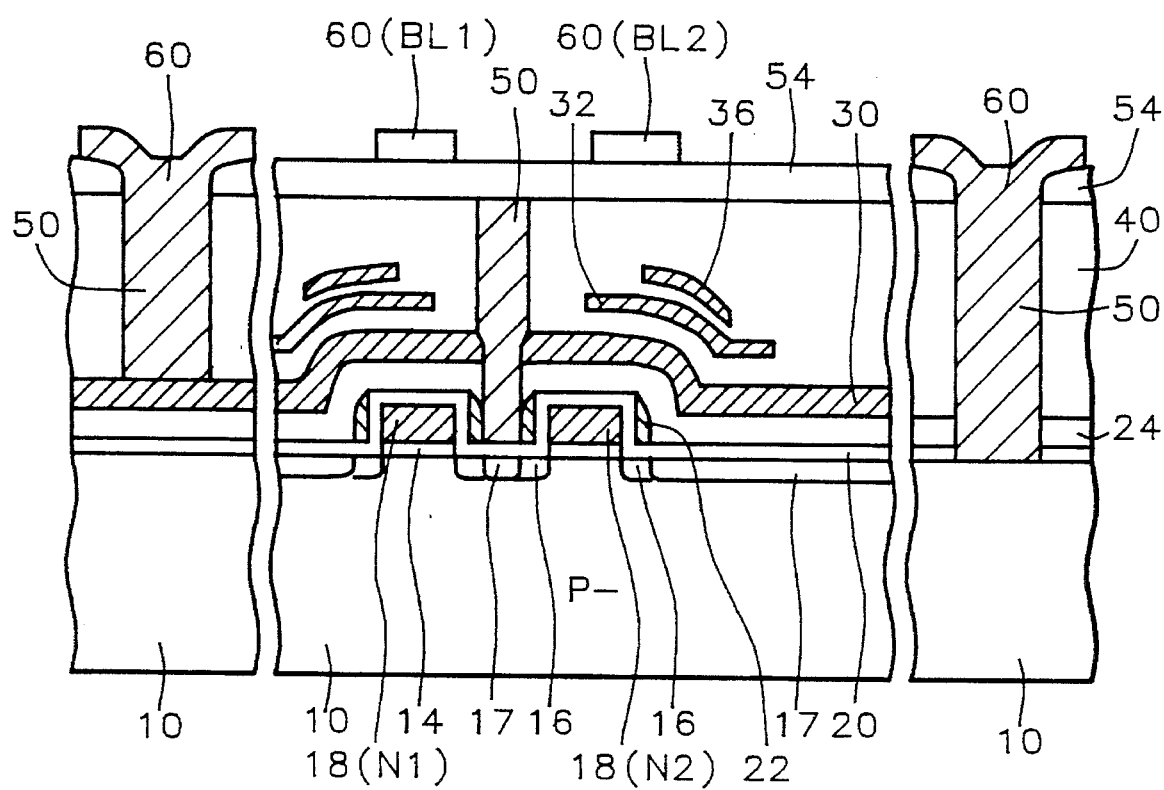
FIG. 6 shows a schematic cross sectional of a unified contact plug formed between the ground plate $V_{ss}$ formed from a polysilicon layer and the common source/drain area of the driver transistors in the SRAM cell and the concurrent formation of the ground contact in the peripheral area of the SRAM chip.

Referring now to FIG. 6, a unified contact plug structure is shown for the interconnection of the ground plate to the common source/drain area of the two driver transistors in the SRAM cell, labeled N1 and N2 in FIG. 1. Since the process is identical to the previous description process for forming the node contact and bit line contact, and is indeed formed concurrently with the node contact, all layer are numerically labeled the same. As shown in FIG. 6, the plug is formed similar to the bit line plug in FIG. 5. An opening is etched in the second polysilicon layer 30 aligned over the source/drain areas of the FET driver transistor N1 and N2. However, unlike the bit line layer 30 which is an isolated portion of layer 30, the Vss ground plan layer extends between the P-channel thin film transistors and the driver transistor N1 and N2, and further extends to the periphery of the chip, as shown in FIG. 6, where the ground contact is formed by another unified contact plug. Note that the fifth insulating layer insulates the plug between the N1 and N2 FETs, and the electrical connection is completed at the peripheral plug using the first metal layer 60. Also shown is the metal layer 60 (BLC1) and 60 (BLC2), as depicted in the circuit schematic of FIG. 1. Portion of the polysilicon layer 32 and 36 are also shown in the FIG. 6.

Figure 7:
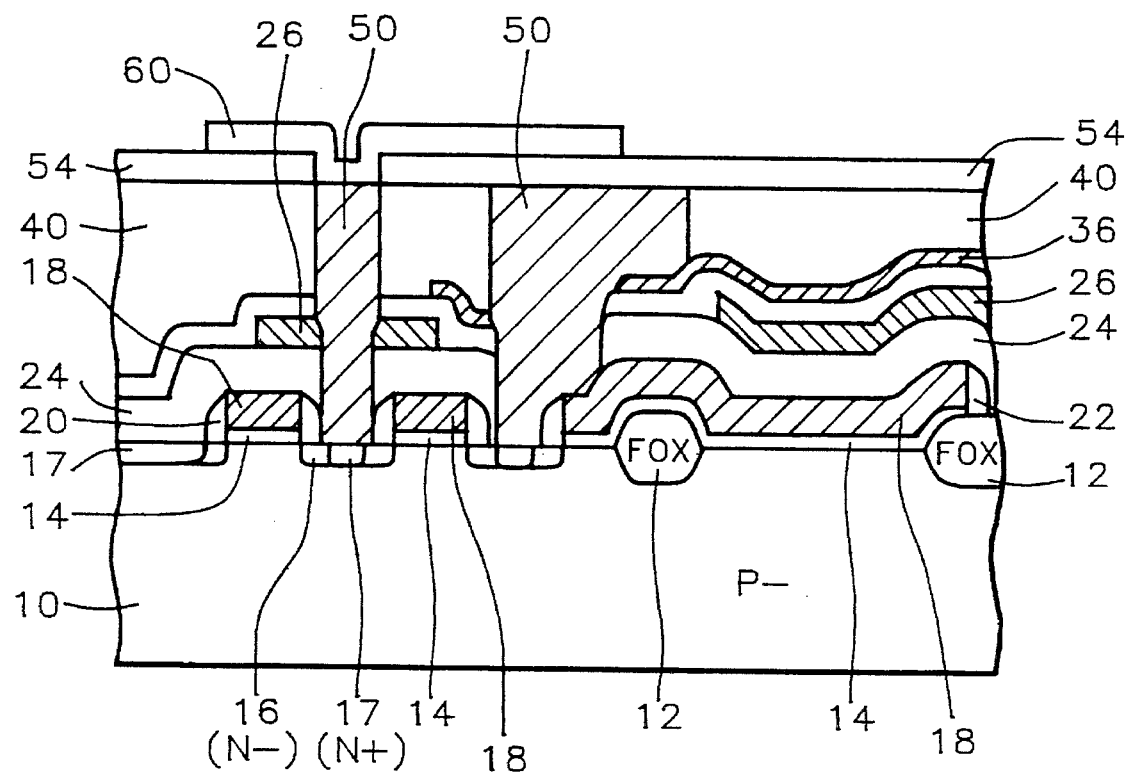
FIG. 7 shows a schematic cross section of a SRAM cell fabricated with load resistors instead of the P-type thin film transistor (P-TFT).

This unified contact plug is equally applicable to SRAM circuits having polysilicon resistor loads instead of $P^-$ thin film transistors (P-TFT) (P1 and P2 in FIG. 1). A schematic cross section for a SRAM cell having a resistor load formed from the third polysilicon layer 36 is shown in FIG. 7. The preferred thickness of layer 36 is between about 200 to 800 Angstroms. The layer 36 is preferably doped N-type using ion implantation of arsenic ($As^{75}$) ions having a implant dose of between about 1.0 E 13 to 1.0 E 15 ions/cm$^2$ and an implant energy of between about 30 to 40 KeV. The polysilicon interconnect for the load resistor can be formed by a phosphorus ion ($P^{31}$) implantation at an implant energy of between about 25 to 35 KeV., and the implant dose selected to provide a final concentration of between about 1.0 E 18 to 1.0 E 21 atoms/cm$^3$. The SRAM cell in FIG. 7 is shown with more conventional sidewall spacers 22 formed by etching back a silicon oxide layer.

While the invention has been particularly shown and described with reference to the preferred embodiments thereof, it will be understood by those skilled in the art that various changes in form and details may be made without departing from the spirit and scope of the invention.

What is claimed is:

1. A method of making unified contact plugs on static random access memory (SRAM) semiconductor devices, comprising the steps of:

providing a semiconductor substrate having field effect transistors (FETs) formed on a substrate surface, said FETs having gate electrodes formed from a first polysilicon layer, and further having a cap oxide and polysilicon sidewall spacers on said FET gate electrodes and source/drain contact areas on said substrate surface;

depositing a blanket first insulating layer on said FETs on said substrate;

forming over said first insulating layer a multilayer structure comprising in increasing distance from said substrate surface a patterned second, third and fourth polysilicon layers that include openings aligned over source/drain contact areas for contacts, and having between said patterned second, third and fourth polysilicon layers, in increasing distance from said substrate surface a second, third and fourth insulating layers, and furthermore portions of said patterned second, third and fourth polysilicon layers forming device elements and interconnecting portions for said SRAM device;

anisotropically and selectively etching contact openings in said first, second, third and fourth insulating layers using a photoresist mask, said selective etching stopping at and exposing portions of said fourth, third and second polysilicon layers and also stopping at said polysilicon sidewall spacers in said contact openings, and furthermore said exposed portions of said fourth, third and second polysilicon layers in said contact openings providing a masking effect in said contact openings for subsequent etching of said first, second, third and fourth insulating layers;

removing said photoresist mask;

forming metal plugs in said contact openings, and thereby concurrently interconnecting said exposed portions of said fourth, third and second polysilicon layers and said FET source/drain contact areas, and thereby forming said unified contact plugs for said SRAM devices;

depositing a fifth insulating layer and etching openings in said fifth insulating layer to expose said metal plugs; and depositing a first metal layer and patterning said metal layer forming an interconnecting metal layer, and thereby completing said SRAM devices to a first metal interconnect level.

2. The method of claim 1, wherein said first polysilicon layer forms the gate electrodes of the FETs on the substrate for pass and driver transistors on said SRAM semiconductor device.

3. The method of claim 1, wherein, said patterned third and fourth polysilicon layers and said third insulating layer form P-channel thin film transistors for said SRAM devices.

4. The method of claim 1, wherein said openings in said second, third and fourth polysilicon layers provide a self-aligning etch stop mask for forming contact opening in an underlying said first, second, third and fourth insulating layers to said source/drain contact areas.

5. The method of claim 1, wherein said anisotropically and selectively etching of said contact openings are carried out in a plasma etcher having an etch rate ratio of silicon oxide to polysilicon greater than about 30.0 to 1.0.

6. The method of claim 5, wherein said anisotropically and selectively etching is in a plasma etcher having a etch gas mixture containing carbon tetrafluoride ($CF_4$) and Hydrogen ($H_2$).

7. The method of claim 1, wherein said metal plugs are formed by depositing a conformal blanket tungsten layer on said fourth insulating layer and in said contact openings, and etching back said tungsten layer to a surface of said fourth insulating layer.

8. A method of fabricating an array of static random access memory (SRAM) cells having field effect transistors (FETs) and thin film transistors (TFT) using an unified metal plug structure, comprising the steps of:

providing a semiconductor substrate having device areas and field oxide areas;

forming a first gate oxide on said device areas;

depositing a blanket first polysilicon layer on said device areas and said field oxide areas;

patterning said first polysilicon layer and forming field effect transistor (FET) gate electrodes on said device areas and word lines elsewhere on said substrate, and concurrently forming gate electrodes for driver transistors in said SRAM cells;

depositing a blanket conformal cap insulating layer on said gate electrodes of said FET and driver transistors and elsewhere on said substrate;

depositing a blanket sidewall polysilicon layer on said cap insulating layer;

anisotropically etching back said sidewall polysilicon layer to said cap insulating layer, and thereby forming polysilicon sidewall spacers on said gate electrodes of said FET and driver transistors;

implanting dopant atoms in said substrate adjacent to said gate electrodes of said FET and driver transistors, and thereby forming FET source/drain contact areas and completing said FETs, and furthermore;

depositing a blanket first insulating layer on said substrate;

depositing a blanket second polysilicon layer on said first insulating layer;

patterning said second polysilicon layer, and thereby forming electrically conducting patterned layer on said first insulating layer, and furthermore, said second polysilicon layer having portions with openings aligned over said FET source/drain contact areas on said substrate;

depositing a blanket second insulating layer on said patterned second polysilicon layer and elsewhere on said first insulating layer;

depositing a blanket third polysilicon layer on said second insulating layer;

patterning said third polysilicon layer, and thereby forming gate electrodes for said thin film transistor (TFT), and furthermore, providing openings in portions of said third polysilicon layer aligned over said FET source/drain contact areas;

depositing a blanket third insulating layer on said patterned third polysilicon layer, and thereby forming a second gate oxide on said TFT gate electrodes;

depositing a blanket fourth polysilicon layer on said third insulating layer;

doping selectively said fourth polysilicon layer adjacent to said TFT gate electrodes while leaving undoped portions over said TFT gate electrodes, and thereby forming TFT source/drain areas;

patterning said fourth polysilicon layer and thereby forming TFT channel regions over said TFT gate electrodes, and furthermore having portions aligned over said FET source/drain contact areas;

depositing a blanket fourth insulating layer, and annealing said fourth insulating layer to form a planar surface;

photoresist masking and selectively and anisotropically etching contact openings in said fourth, third and second insulating layers and further in said cap insulating layer to said FET source/drain contacts areas; said selective etching stopping at and exposing portions of said fourth, third, second and first polysilicon layers in said contact openings;

removing said photoresist mask; and forming metal plugs in said contact openings, and thereby concurrently interconnecting said patterned first, second, third and fourth polysilicon layers and said FET source/drain contact areas, said first, second, third and fourth polysilicon layers providing interconnects to said metal plugs in said contact openings for said SRAM cells;

depositing a fifth insulating layer and etching opening in said fifth insulating layer to expose said metal plugs;

depositing a metal layer and patterning said metal layer forming an interconnecting metal layer, and thereby completing said array of SRAM cells.

9. The method of claim 8, wherein a thickness of said first polysilicon layer is between about 1000 to 3500 Angstroms, and is doped with an $N^+$ dopant.

10. The method of claim 8, wherein said cap insulating layer is silicon oxide ($SiO_2$) having a thickness of between about 500 to 1000 Angstroms.

11. The method of claim 8, wherein said sidewall polysilicon layer is undoped having a thickness of between about 1000 to 2000 Angstroms.

12. The method of claim 8, wherein said first insulating layer is silicon oxide having a thickness of between about 700 to 2000 Angstroms.

13. The method of claim 8, wherein said second polysilicon layer is $N^+$ doped and having a thickness of between about 700 to 3000 Angstroms.

14. The method of claim 8, wherein said second insulating layer is composed of silicon oxide and is between about 700 to 2000 Angstroms thick.

15. The method of claim 8, wherein said third polysilicon layer is doped $N^+$ and is between about 300 to 1000 Angstroms thick.

16. The method of claim 8, wherein said third insulating layer forming a second gate oxide on said TFT gate electrodes is composed of silicon oxide and is between about 50 to 500 Angstroms thick.

17. The method of claim 8, wherein said fourth polysilicon is doped $N^-$ over said TFT gate electrodes having a concentration of between about $1.0 E 16$ to $1.0 E 18$ atoms/$cm^3$, and doped $P^+$ in said TFT source/drain areas having a concentration of between about $1.0 E 18$ to $1.0 E 20$ atoms/$cm^3$.

18. The method of claim 8, wherein said fourth polysilicon layer is replaces by an amorphous silicon layer formed by low pressure chemical vapor deposition (LPCVD) using silane ($SiH_4$) and a deposition temperature of between about 450° to 560° C.

19. The method of claim 8, wherein said polysilicon sidewall spacers increase the alignment tolerance for aligning the openings in the second and third polysilicon over said FET source/drain contact areas.

20. The method of claim 8, wherein the selective and anisotropic etching contact openings in said fourth, third and second insulating layers is carried out in a reactant gas having an etch rate ratio of silicon oxide to polysilicon greater than about 30.0 to 1.0.

21. The method of claim 18, wherein the metal plugs in said contact openings electrically connect amorphous and polysilicon layers forming ohmic contacts.

22. The method of claim 8, wherein said metal plugs are tungsten metal formed by chemical vapor deposition (CVD) in a tungsten hexafluoride ($WF_6$) reactant gas and etched back to said fourth insulating layer by plasma etching in an etch gas of carbon tetraflouride ($CF_4$).

23. The method of claim 8, wherein some of said metal plugs form node contacts connecting the drain areas of thin film transistors (TFTs), the gate electrodes of second TFTs in each SRAM cell to the source/drain contact areas of underlying FETs, and furthermore, other metal plugs, concurrently form bit line contacts to said source/drain contact areas of said FETs and form a ground contact to a ground plate of the FETs in said SRAM cells.

24. The method of claim 8, wherein a concurrent formation of said contact openings reduce the number masking steps by three and the number of etching steps by three in the fabrication of the SRAM cells.

25. A method of fabricating static random access memory (SRAM) circuits on a semiconductor substrate, each said SRAM circuits having an array of SRAM cells and an unified metal plug structure, comprising the steps of:

providing a semiconductor substrate with SRAM circuit areas having device and field oxide areas, and further having peripheral addressing and read/write circuits for accessing said array of SRAM cells, said array of SRAM cells having said unified metal plug structure formed by;

thermally growing a first gate oxide on said device areas, depositing a blanket first polysilicon layer on said device areas and said field oxide areas;

patterning said first polysilicon layer and forming field effect transistor (FET) gate electrodes on said device areas and word lines elsewhere on said substrate, and concurrently forming gate electrodes for driver transistors in said SRAM cells;

depositing a blanket conformal cap insulating layer on said FET and driver gate electrodes and elsewhere on said substrate;

depositing a blanket sidewall polysilicon layer on said cap insulating layer;

anisotropically etching back said sidewall polysilicon layer to said cap insulating layer, and thereby forming polysilicon sidewall spacers on said FET and driver gate electrodes;

implanting dopant atoms in said substrate adjacent to said FET and driver gate electrodes, and thereby forming FET source/drain contact areas and completing said FETs, and furthermore;

depositing a blanket first insulating layer on said FET and driver gate electrodes and elsewhere on said substrate;

depositing a blanket second polysilicon layer on said first insulating layer;

patterning said second polysilicon layer, and thereby forming electrically conducting patterned layer on said first insulating layer, and furthermore, said second polysilicon layer having portions with openings aligned over said FET source/drain contact areas on said substrate;

depositing a blanket second insulating layer on said patterned second polysilicon layer and elsewhere on said first insulating layer;

depositing a blanket third polysilicon layer on said second insulating layer;

patterning said third polysilicon layer, and thereby forming gate electrodes for said thin film transistor (TFT), and furthermore, providing openings in portions of said third polysilicon layer aligned over said FET source/drain contact areas;

depositing a blanket third insulating layer on said patterned third polysilicon layer, and thereby forming a second gate oxide on said TFT gate electrodes;

depositing a blanket fourth polysilicon layer on said third insulating layer;

doping selectively said fourth polysilicon layer adjacent to said TFT gate electrodes while leaving undoped portions over said TFT gate electrodes, and thereby forming TFT source/drain areas;

patterning said fourth polysilicon layer and thereby forming TFT channel regions over said TFT gate electrodes, and furthermore having portions aligned over said FET source/drain contact areas;

depositing a blanket fourth insulating layer, and annealing said fourth insulating layer to form a planar surface;

photoresist masking and selectively and anisotropically etching contact openings in said fourth, third and second insulating layers and further in said cap insulating layer to said FET source/drain contacts areas; said selective etching stopping at and exposing portions of said fourth, third, second and first polysilicon layers in said contact openings;

removing said photoresist mask; and forming metal plugs in said contact openings, and thereby concurrently interconnecting said patterned first, second, third and fourth polysilicon layers and said FET source/drain contact areas, said first, second, third and fourth polysilicon layers providing interconnects to said metal plugs in said contact openings for said SRAM cells;

depositing a fifth insulating layer and etching opening in said fifth insulating layer to expose said metal plugs;

depositing a first metal layer and patterning said first metal layer forming an interconnecting metal layer, and thereby completing said SRAM circuits.

26. The method of claim 25, wherein said first insulating layer is silicon oxide having a thickness of between about 700 to 2000 Angstroms.

27. The method of claim 25, wherein said second polysilicon layer is $N^+$ doped and having a thickness of between about 700 to 3000 Angstroms.

28. The method of claim 25, wherein said polysilicon sidewall spacers increases the alignment tolerance for aligning the openings in said second and third polysilicon layer over said FET source/drain contact areas.

29. The method of claim 25, wherein the metal plugs in said contact openings electrically connect first, second, third and fourth polysilicon layers to form ohmic contacts.

30. The method of claim 25, wherein said metal plugs are tungsten metal formed by chemical vapor deposition (CVD) in a tungsten hexafluoride ($WF_6$) reactant gas and etched back to said fourth insulating layer by plasma etching in an etch gas of carbon tetraflouride ($CF_4$).

31. The method of claim 25, wherein some of said metal plugs form node contacts connecting drain areas of a P-channel thin film transistors (TFTs), gate electrodes of second TFTs in each SRAM cell to the source/drain contact areas of underlying FETs, and furthermore, other said metal plugs, concurrently form bit line contacts to said source/ drain contact areas of said FETs and provide a ground contact to a ground plate formed from said second polysilicon layer in said SRAM cells.

32. The method of claim 31, wherein load resistors are used inplace of said P-channel thin film transistors (P-TFT) for fabricating static random access memoty (SRAM) circuits.

* * * * *